United States Patent
Chow et al.

(10) Patent No.: US 7,911,279 B2
(45) Date of Patent: Mar. 22, 2011

(54) AMPLIFIER WITH BIAS CIRCUIT PROVIDING IMPROVED LINEARITY

(75) Inventors: Yut Hoong Chow, Malaysia (MY); Hiang Teik Tan, Penang (MY)

(73) Assignee: Avago Technologies Wireless IP (Singapore) Pte. Ltd.

( * ) Notice: Subject to any disclaimer, the term of this patent is extended or adjusted under 35 U.S.C. 154(b) by 27 days.

(21) Appl. No.: 12/323,691

(22) Filed: Nov. 26, 2008

(65) Prior Publication Data

US 2010/0127776 A1    May 27, 2010

(51) Int. Cl.
*H03F 3/04* (2006.01)
(52) U.S. Cl. ........................................ 330/311; 330/296
(58) Field of Classification Search .................. 330/311, 330/285, 296
See application file for complete search history.

(56) References Cited

U.S. PATENT DOCUMENTS

| | | | |
|---|---|---|---|
| 4,663,599 A * | 5/1987 | Patch ............................. | 330/311 |
| 6,271,695 B1 * | 8/2001 | Gramegna et al. ............ | 327/110 |
| 6,778,016 B2 * | 8/2004 | Luo ................................ | 330/288 |
| 6,987,422 B2 * | 1/2006 | Vice .............................. | 330/285 |

* cited by examiner

*Primary Examiner* — Henry K Choe (57) ABSTRACT

An amplifying device includes a cascode amplifier and a biasing circuit. The cascode amplifier is configured to receive an input signal and to output an amplified output signal corresponding to the input signal. The biasing circuit is configured to bias the cascode amplifier, the biasing circuit including a first current mirror and a second current mirror stacked on the first current mirror. The biasing circuit improves linearity of the cascode amplifier across a wide temperature range.

18 Claims, 4 Drawing Sheets

AMPLIFIER WITH BIAS CIRCUIT PROVIDING IMPROVED LINEARITY

BACKGROUND

Modern electronic devices require various types of amplifies for any number of applications, including low noise amplifiers and power amplifiers. Cascode amplifier circuits, in particular, are often incorporated into amplifier designs. For example, cascode amplifier circuits may be used in very high frequency amplifiers that work at millimeter wave frequencies (e.g., above 20 GHz). Examples of electronic devices that typically incorporate amplifiers having cascode amplifier circuits include Global Positioning System (GPS) transceivers, cellular telephones, cellular base station amplifiers, personal digital assistants (PDAs) and electronic organizers, portable electronic games, and the like, although such circuits may be included in nearly all types of electronic devices.

Figure 1:
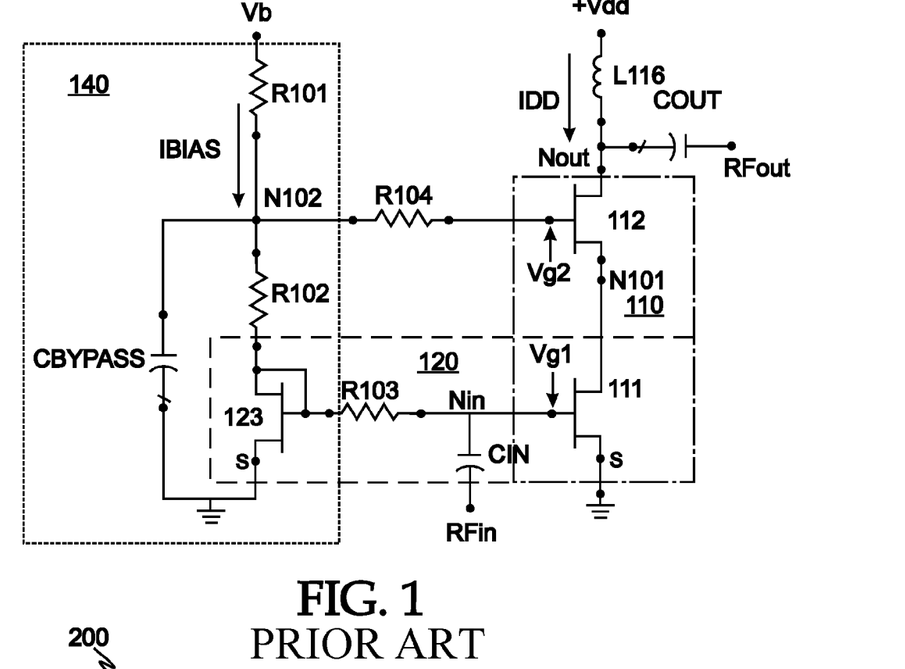
FIG. 1 is a block diagram illustrating a conventional amplifier circuit.

FIG. 1 is a circuit diagram depicting a conventional amplifier circuit 100, which includes cascode amplifier 110 and biasing circuit 140 for biasing the cascode amplifier 110. The cascode amplifier 110 includes cascode transistors 111 and 112 connected at low impedance node N101. Transistor 111 has a source connected to a low voltage supply (e.g., ground), a drain connected to node N101, and a gate connected to input node Nin. The gate of transistor 111 is also connected to a gate of transistor 123 in biasing circuit 140 through resistor R103, thus forming a current mirror 120. Transistor 112 has a source connected node N101, a drain connected to output node Nout and a gate connected to low impedance node N102 in biasing circuit 140 through resistor R104. Output node Nout is connected to a power supply voltage source, which provides power supply voltage Vdd via inductor L116.

Generally, radio frequency (RF) signals are received at input port RFin, and pass though input capacitor Cin to input node Nin. Corresponding amplified RF signals are output from output node Nout, passing through output capacitor Cout to output port RFout.

Referring to FIG. 1, transistors 111 and 112 share the same current IDD, provided through by inductor L116, which receives power supply voltage Vdd. The gate of transistor 112 is biased from a voltage source with minimal source impedance. Linearity may be improved by the first gain device, i.e., transistor 111, operating with no drain voltage swing, since it is connected to node N101. Also, the cascode amplifier 110 is biased by capacitor CBYPASS, connected between node N102 and the low voltage source. That is, capacitor CBYPASS generally filters out RF fluctuations and maintains a stable voltage at node N102 at the junction between resistors R102 and R104 to bias the gate of transistor 112. In addition, transistor 123 of the current mirror 120 biases transistors 111 and 112 of the cascode amplifier 110. A conventional cascode amplifier, such as cascode amplifier 110 of FIG. 1, typically has an output third order intercept point (OIP3) about 2-3 dBm better than a simple common source field-effect transistor (FET), for a given device size and bias.

However, the amplifier circuit 100 has a number of drawbacks. For example, transistor 112 limits the voltage swing that is available at the output node Nout, which limits the maximum linearity that can be achieved as input (or output) power is increased. The output power range over which optimum linearity is maintained is therefore reduced. The reduced range may be measured by the reduction in the output 1 dB compression point. Also, OIP3 values, which are sensitive to variations in temperature, fluctuate a relatively large amount.

Figure 2:
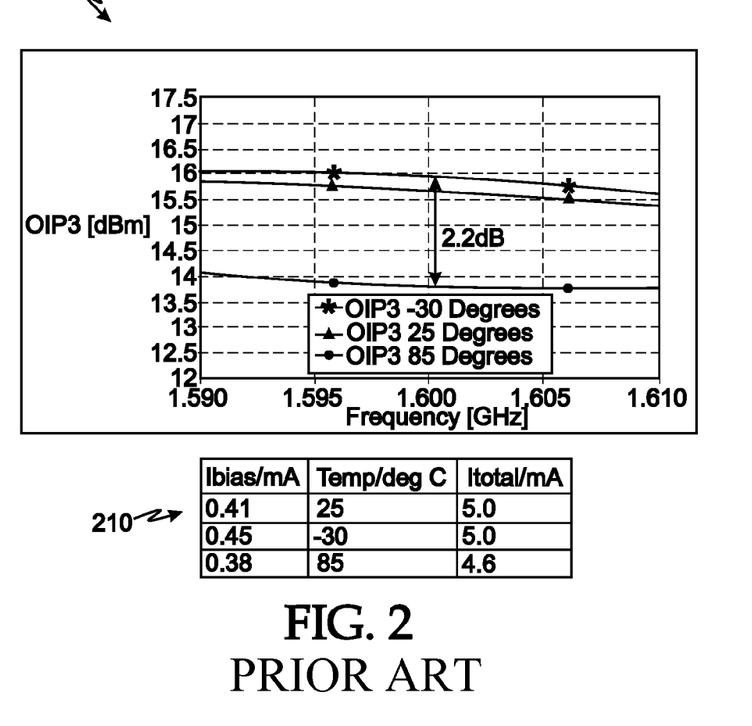
FIG. 2 is a graph illustrating OIP3 versus frequency at different temperatures in a conventional amplifier circuit.

For example, FIG. 2 includes graph 200, showing OIP3 values of cascode amplifier 110 over a range of frequencies (e.g., global positioning system (GPS) frequencies) at different operating temperatures (25° C., −30° C., 85° C.). Table 210 shows changes in bias current IBIAS and total current Itotal with respect to temperature. Itotal is the sum of IBIAS and IDD, although Itotal may be considered substantially the same as IDD since IBIAS is typically about five percent of IDD.

In particular, graph 200 shows an example in which IDD=5 mA and Vdd=+2.7V, resulting in a peak difference of 2.2 dB in OIP3, e.g., occurring at 1.600 GHz, when the temperature varies from −30° C. to 85° C. The changes in OIP3 are caused by resistance values of bias resistors (e.g., resistor R101) increasing at high temperatures, which reduces bias current IBIAS to the bias circuit 140. Also, transistor threshold voltages (e.g., of transistors 111 and 112) are reduced at high temperatures. As a result, total current Itotal is reduced and the OIP3 drops from the nominal 25° C. room temperature performance of the amplifier circuit 100. The situation is reversed when temperature decreases below the nominal temperature, in which bias current IBIAS and OIP3 increase.

Table 210 in FIG. 2 shows bias current IBIAS and total current Itotal corresponding to the different operating temperatures (25° C., −30° C., 85° C.). Referring to table 210, the change in total current Itotal from nominal 25° C. room temperature performance is about ten percent (e.g., from 5.0 mA at 25° C. to 4.5 mA at 85° C.) across the entire temperature range −30° C. to 85° C.

SUMMARY

In a representative embodiment, an amplifying device includes a cascode amplifier and a biasing circuit. The cascode amplifier is configured to receive an input signal and to output an amplified output signal corresponding to the input signal. The biasing circuit is configured to bias the cascode amplifier, the biasing circuit including a first current mirror and a second current mirror stacked on the first current mirror. The biasing circuit improves linearity of the cascode amplifier.

In another representative embodiment, a biasing circuit for biasing a cascode amplifier of an amplifying device includes first and second current mirrors. The cascode amplifier receives an input signal and outputs an amplified output signal corresponding to the input signal. The first current mirror is configured to receive the input signal. The second current mirror is connected to the first current mirror and the cascode amplifier, and provides a mirrored bias current to the cascode amplifier that varies directly with a current of the first current mirror. A current of the cascode amplifier varies inversely with respect to the mirrored bias current, reducing changes to the current of the cascode amplifier in response to a changed condition.

In yet another representative embodiment, a device for amplifying a radio frequency (RF) signal includes first through fifth transistors. The first transistor includes a source connected to a low voltage source and a gate connected to an input node for receiving the RF signal. The second transistor forms a cascode amplifier with the first transistor, and includes a source connected to a drain of the first transistor, a drain connected to a voltage source and an output node for outputting an amplified RF signal based on the input RF signal, and a gate connected to a second current mirror. The third transistor forms a first current mirror with the first transistor, and includes a source connected to the low voltage source and a gate connected to the gate of the first transistor.

The fourth transistor includes a source connected to a drain of the third transistor and a drain connected to a bias voltage source. The fifth transistor forms a second current mirror with the fourth transistor, and includes a source connected to the low voltage source, a drain connected to the drain of the second transistor and a gate connected to the gate of the second transistor. A drain current of the fifth transistor biases the cascode amplifier.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Figure 3:
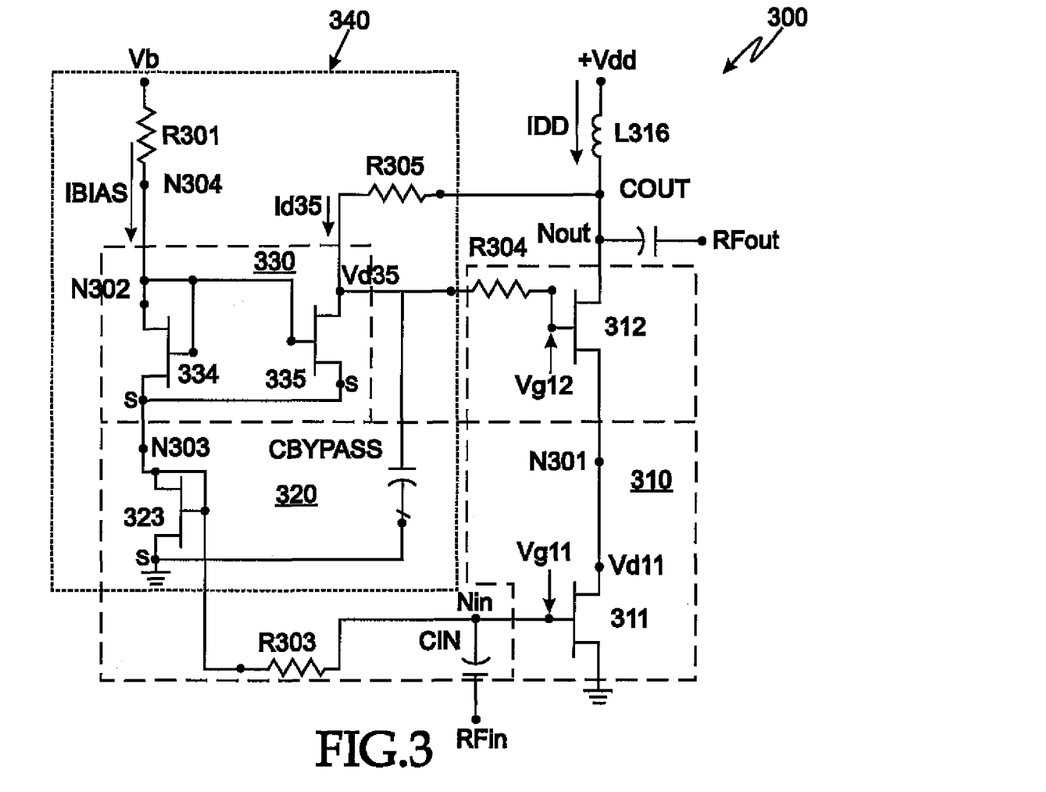
FIG. 3 is a block diagram illustrating an amplifier circuit, according to a representative embodiment.

FIG. 3 is a block diagram depicting an amplifier circuit 300 of an electronic device, according to a representative embodiment. The amplifier circuit 300 may be used to achieve high gain and high linearity with a low quiescent current, for example.

The amplifier circuit 300 includes cascode amplifier 310 and biasing circuit 340 for biasing the cascode amplifier 310, having a low quiescent current. The cascode amplifier 310 includes cascode transistors 311 and 312 connected at low impedance node N301. Transistor 311 has a source connected to a low voltage supply (e.g., ground), a drain connected to node N301, and a gate connected to input node Nin. The gate of transistor 311 is also connected to a gate of transistor 323 in biasing circuit 340 through resistor R303, thus forming a first current mirror 320, discussed below. Transistor 312 has a source connected node N301, a drain connected to output node Nout and a gate connected to low impedance node N302 in biasing circuit 340 through resistor R304. Output node Nout is connected to a power supply voltage source, which provides power supply voltage Vdd. The power supply voltage source is connected to the cascode amplifier 310 through inductor L316, providing current IDD.

Generally, RF signals are received at input port RFin, and pass though input capacitor Cin to input node Nin of the cascode amplifier 310. Corresponding amplified RF signals are output from output node Nout, passing through output capacitor Cout to output port RFout. Amplifier gain is improved by connecting transistor 311 as a common source amplifier and transistor 312 as a common gate amplifier.

The biasing circuit 340 provides two current mirrors, first current mirror 320 and second current mirror 330. A bias voltage source provides bias voltage Vb to the biasing circuit 340. In various embodiments, the bias voltage Vb may be a fixed input voltage, for example, that is derived from the power supply voltage Vdd or supplied from an independent source. The bias voltage source is connected to the second current mirror 330 through resistor R301, which provides bias current IBIAS.

The first current mirror 320 is formed by transistor 311 of the cascode amplifier 310 and transistor 323 of the biasing circuit 340. Transistor 323 includes a source connected to the low voltage source, a drain connected to low impedance node N303, and a gate connected to the gate of transistor 311 through resistor R303, as well as the node N303. In the depicted embodiment, the resistance value of resistor R303 is assumed to be close to zero ohms, for example, less than 10 ohms.

The second current mirror 330 is stacked on the first current mirror 320, and thereby directly biases transistor 312 of cascode amplifier 310, and indirectly biases transistor 311. In particular, the second current mirror 330 includes mirror transistor 334 and bias transistor 335. Transistor 334 includes a gate that is connected to its own drain. Transistor 334 also includes a source connected to node N303, a drain connected to bias node N304, and a gate connected to the gate of the transistor 335, as well as to the bias node N304. The node N304 is connected to the bias voltage source through bias resistor R301, and thus receives bias current IBIAS. Transistor 335 of the second current mirror 330 includes a source connected to node N303, a drain connected to output node Nout through resistor R305 and connected to the gate of transistor 312 through resistor R304, and a gate connected to the gate of transistor 334. In this configuration, the bias current IBIAS is the drain current of transistor 334, and is therefore mirrored through the second current mirror 330 into the drain of transistor 335.

In the depicted configuration of representative amplifier circuit 300, bias to the gate of cascode transistor 312 is taken from the drain of transistor 335. That is, the drain voltage Vd35 of transistor 335 is generated by the drain current Id35 of transistor 335. The drain current Id35 is based on the mirrored bias current IBIAS, and may be determined by the ratio of the size of transistor 335 to the size of transistor 334 multiplied by IBIAS, for example. Under quiescent bias conditions, this is equal to the power supply voltage Vdd minus the voltage drop across resistor R305. Unlike the conventional cascode amplifier, e.g., cascode amplifier 110 in FIG. 1, the impedance at bias node N302 is relatively high without capacitor CBYPASS.

In the depicted embodiment, the resistance value of resistor R304 is assumed to be close to zero ohms, for example, less than 10 ohms, and the resistance value of resistor R305 is thousands of ohms, for example, 7200 ohms, although the resistance values of all the resistors may vary to provide unique benefits for any particular situation or to meet application specific design requirements of various implementations, as would be apparent to one skilled in the art. There is very little DC current flowing into the gate of transistor 312 through transistor R304. Therefore, there is almost no DC voltage across resistor R304, which is included to enhance stability of the circuit. Accordingly, the gate voltage Vg12 at the gate of transistor 312 is substantially the same the drain voltage Vd35 at the drain of transistor 335, and therefore is likewise based on the bias current IBIAS mirrored into transistor 335. Capacitor CBYPASS does not change the operating conditions as current increases because it is used as a low impedance at RF frequencies to improve the gain of the circuit, thus in DC operations, capacitor CBYPASS has no effect.

Linearity of the output signal from amplifier circuit 300 is improved by minimizing drain voltage and drain current changes through the main amplifying transistor, transistor 311. During large signal conditions, when the voltage of the input signal RFin is increased, the current draw through transistor 323 is increased. More particularly, large signal conditions are dynamic conditions that would change quiescent or bias conditions momentarily during one cycle of the input signal RFin. For example, the value of current IDD with no input signal RFin may be about 6 mA. When the input signal RFin is very small (small signal condition or non-large signal condition), the current IDD does not change. When the input signal RFin is increased, the current IDD (or the quiescent bias current) will be perturbed from its quiescent point and increase. Thus, large signal conditions are signal conditions which perturb the amplifier circuit 300 from its quiescent operating bias.

The increase in current drawn through transistor 323 forces a corresponding increase of current through transistor 334, which is mirrored into the drain of transistor 335 through second current mirror 330, thereby proportionately increasing the current through transistor 335 and resistor R305. As stated above, the drain voltage Vd35 at transistor 335 may be determined by the supply voltage VDD minus the voltage across resistor R305. Therefore, when the voltage across resistor R305 increases, for example, in response to the increased current through resistor R305, the drain voltage Vd35 of transistor 335 decreases.

Also, as stated above, the gate voltage Vg12 of transistor 312 is substantially the same as the drain voltage Vd35 of transistor 335. Therefore, the gate voltage Vg12 decreases proportionately with the decreased drain voltage Vd35. The voltage difference between the gate voltage Vg12 and the source voltage Vs12 of transistor 312 is essentially constant. Therefore, when the gate voltage Vg12 decreases, the source voltage Vs12 likewise decreases. Also, the source voltage Vs12 is the same as the drain voltage Vd11 of transistor 311 within cascode 310. Therefore, when the source voltage Vs12 decreases, the drain voltage Vd11 likewise decreases. Since the drain current Id11 of transistor 311 is a function of the drain voltage Vd11, the drain current Id11 also decreases, thus reducing current variation, e.g., resulting from the large signal conditions or other increase in voltage of the input signal RFin.

Transistor 311 is thus forced into operating as an amplifier with minimal drain current and drain voltage fluctuations, resulting in a more linear mode of operation, even at large excursions of input signal RFin. Further, current IDD is dependent on the drain voltage Vd11 and the gate voltage Vg11 of transistor 311. Therefore, a change in either one results in a corresponding change in current IDD. For example, when Vd11 decreases, as discussed above, current IDD also decreases, thereby compensating for perturbation of current IDD.

The transistors 311, 312, 323, 334 and 335 may be field-effect transistors (FETs), such as gallium arsenide FETs (GaAsFETs), for example. However, other types of FETs and/or other types of transistors within the purview of one of ordinary skill in the art may be incorporated into the amplifier circuit 300, without departing from the spirit and scope of the present teachings. For example, the transistors 311, 312, 323, 334 and 335 may be other types of transistors, such as metal-oxide FETs (MOSFETs), silicon bipolar junction transistors (BJTs), high electron mobility transistors (HEMTs), pseudomorphic HEMTs, heterostructure FETs (HFETs), junction-gate FETs (JFETs), metal-semiconductor FETs (MESFETs), etc. Further, it is understood that the sources/drains of the various transistors may be reversed, without affecting the relevant functionality of the illustrative amplifier circuit 300, depending on design factors of various embodiments.

The sizes of the various transistors 311, 312, 323, 334 and 335 may vary to provide unique benefits for any particular situation or to meet application specific design requirements of various implementations, as would be apparent to one skilled in the art. Also, in various embodiments, the low voltage sources are not necessarily the same, although transistors within a given current source may be connected to the same low voltage source, either directly or through resistors of proportional value.

Further, the resistors R301, R303, R304 and R305 are depicted as single resistors. However, it is understood that these resistors are intended to indicate resistances at depicted locations within the amplifier circuit 300, and may be implemented by multiple resistors in series, or combinations of resistors, inductors and/or any other components capable of providing the appropriate resistances.

Figure 4:
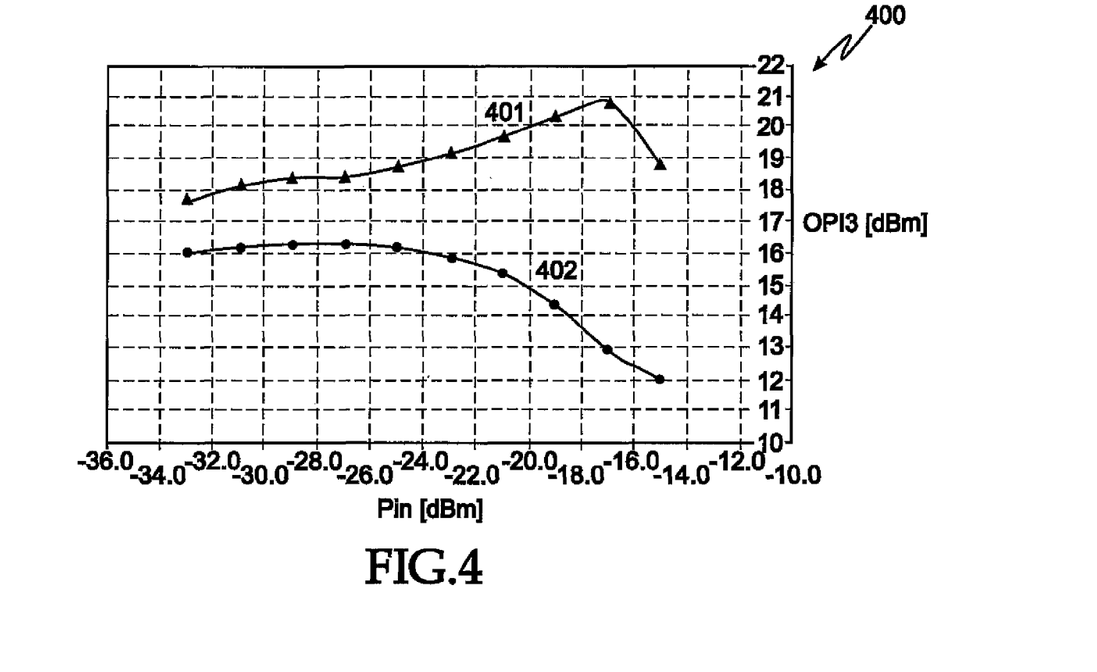
FIG. 4 is a graph illustrating OIP3 versus input power in an amplifier circuit, according to a representative embodiment.

FIG. 4 is a graph 400 illustrating OIP3 values versus input power in an amplifier circuit, according to a representative embodiment, for example, as depicted in FIG. 3. In particular, FIG. 4 shows measured OIP3 of an illustrative amplifier circuit, such as amplifier circuit 300, at 1.6 GHz, in comparison with conventional amplifier circuit 100 shown in FIG. 1.

More particularly, graph 400 shows changes to OIP3 (vertical axis) in response to various power levels Pin (horizontal axis). The current IDD for both amplifier circuits is 5 mA and the tone separation for OIP3 measurements is 5 MHz. The upper curve 401 of graph 400 indicates OIP3 of the amplifier circuit 300, for example, and the lower curve 402 indicates corresponding OIP3 of the conventional amplifier circuit 100. At lower power levels (e.g., −33.0 dBm to −26.0 dBm), the improvement in OIP3 is about 2 dB, and at least this amount of improvement extends across more than 18 dB (e.g., −33.0 dBm to −15.0 dBm) of input power levels. The improvement also mitigates the effect of reduced OP1 dB compression point of the cascode amplifier, as opposed to a simple common source amplifier, such as transistor 111 of FIG. 1.

In addition, the illustrative amplifier circuit 300 of FIG. 3 provides relatively stable OIP3 values during temperature fluctuations. For example, at elevated temperatures, the threshold voltages of transistors 323 and 334 decrease, thus decreasing the current (drain current) flowing though transistors 323 and 334. The reduced current is mirrored into the drain of transistor 335 through second current mirror 330, thereby proportionately decreasing the current through transistor 335, as well as resistor R305. As described above, the drain voltage Vd35 at transistor 335 may be determined by the supply voltage VDD minus the voltage across resistor R305. Therefore, when the voltage across resistor R305 decreases, for example, in response to the decreased current through resistor R305, the drain voltage Vd35 of transistor 335 increases.

Meanwhile, the elevated temperature likewise reduces the threshold voltages of the other transistors of the amplifier circuit 300, including transistors 311 and 312 of the cascode amplifier 310. Accordingly, the (drain) current through each of transistors 311 and 312 tends to decrease in response to the reduced threshold voltage. However, the increased drain voltage Vd35 of transistor 335 is reflected in the drain of transistor 311, for example, which increases the drain current Id11 through transistor 311, offsetting the decrease in the drain current Id11 through transistor 311, due to the increased temperature.

That is, as described above, the gate voltage Vg12 of transistor 312 is substantially the same as the drain voltage Vd35 of transistor 335. Therefore, the gate voltage Vg12 increases proportionately with the increased drain voltage Vd35. The voltage difference between the gate voltage Vg12 and the source voltage Vs12 of transistor 312 is essentially constant. Therefore, when the gate voltage Vg12 increases, the source voltage Vs12 likewise increases. Also, the source voltage Vs12 is the same as the drain voltage Vd11 of transistor 311 within cascode amplifier 310. Therefore, when the source voltage Vs12 increases, the drain voltage Vd11 likewise increases. Since the drain current Id11 of transistor 311 is a function of the drain voltage Vd11, the drain current Id11 also increases, at least partially compensating for the decrease in the drain current Id11 caused by the increased temperature. The net result is that the change in bias current through the main amplifying transistors 311 and 312 of the cascode amplifier 310 is less than that of a conventional amplifier circuit, for example, as shown in FIG. 1.

Of course, it is understood that the functionality is effectively reversed for decreases in temperature, resulting in relatively stable OIP3 values overall. For example, at lower temperatures, the threshold voltages of transistors 323 and 334 increase, thus increasing the current (drain current) flowing though transistors 323 and 334. This increased current is mirrored into the drain of transistor 335 through second current mirror 330, thereby proportionately increasing the current through transistor 335, as well as resistor R305. As described above, when the voltage across resistor R305 increases, the drain voltage Vd35 of transistor 335 decreases.

Meanwhile, the lower temperature increases the threshold voltages of the other transistors of the amplifier circuit 300, including transistors 311 and 312 of the cascode amplifier 310. Accordingly, the (drain) current through each of transistors 311 and 312 tends to increase in response to the increased threshold voltage. However, the decreased drain voltage Vd35 of transistor 335 is reflected in the drain of transistor 311, for example, which decreases the drain current Id11 through transistor 311, offsetting the decrease in the drain current Id11 through transistor 311, due to the lower temperature.

Figure 5:
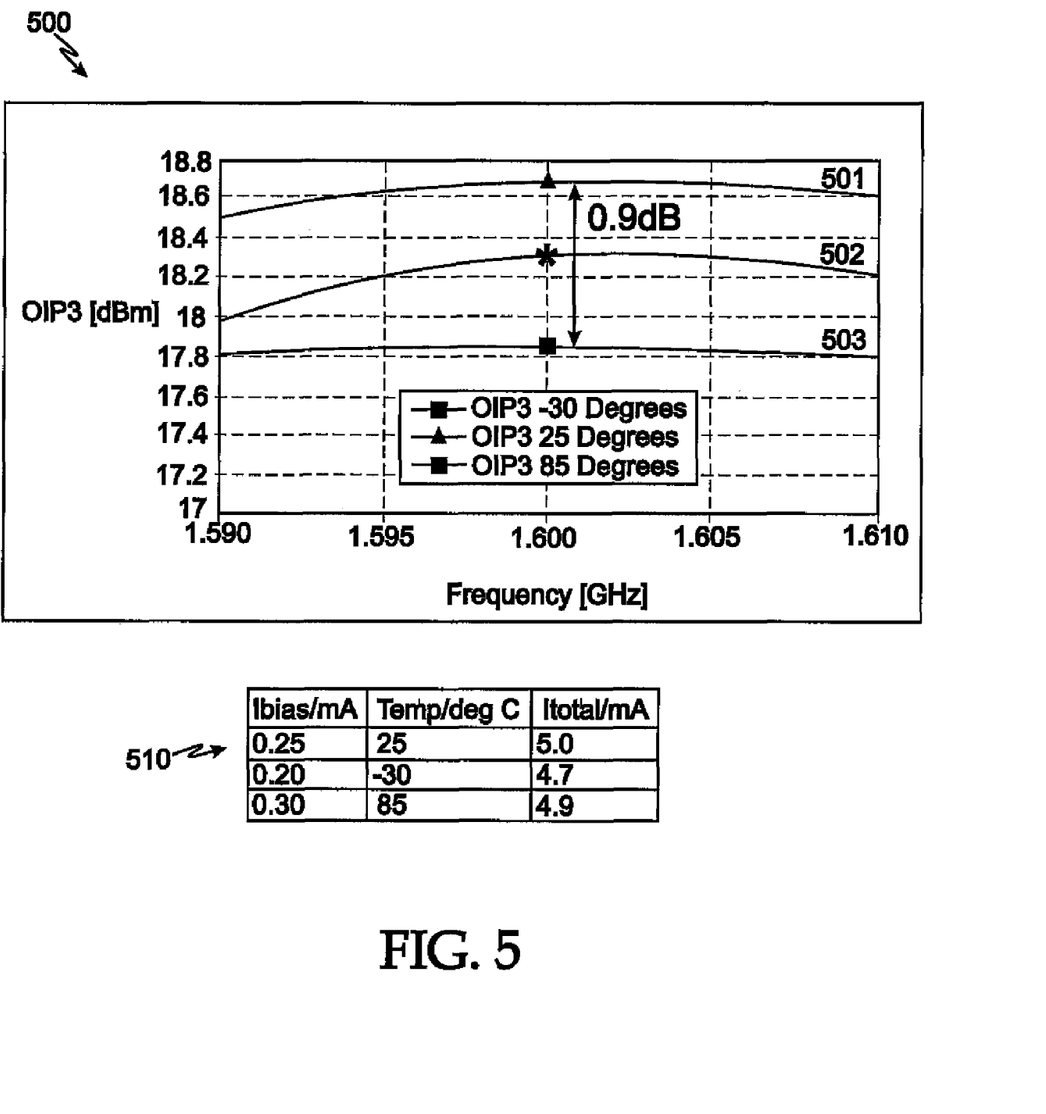
FIG. 5 is a graph illustrating OIP3 versus frequency at different temperatures in an amplifier circuit, according to a representative embodiment.

The OIP3 values corresponding to temperature fluctuations in an amplifier circuit, according to a representative embodiment, are shown in FIG. 5. FIG. 5 includes graph 500, showing the OIP3 values of cascode amplifier 310 over a range of frequencies (e.g., GPS frequencies) at different operating temperatures (25° C., −30° C., 85° C.). Table 510 shows changes in bias current IBIAS and total current Itotal with respect to temperature. Thus, graph 500 and table 510 illustrate the change in linearity as a function of temperature.

More particularly, graph 500 shows an example in which IDD=5 mA and Vdd=+2.7V, resulting in a peak difference of only 0.9 dB in OIP3 when the temperature varies from −30° C. to 85° C. In other words, the stacked second current mirror 330 reduces net changes in OIP3, which would otherwise occur due to increased resistance values of bias resistors and decreased threshold voltages of transistors at high temperatures, and due to decreased resistance values of bias resistors and increased threshold voltages of transistors at low temperatures.

Referring to graph 500, curve 501 indicates OIP3 values of the cascode amplifier at 25° C. over a frequency range of 1.590 GHz to 1.610 GHz. Curves 502 and 503 indicate OIP3 values of the cascode amplifier at 85° C. and −30° C., respectively, over the same frequency range. The largest variation is 0.9 dB between curves 501 and 503 (low temperature curve) at about 1.600 GHz. The peak variation between curves 501 and 502 (high temperature curve) is about 0.5 dB at about 1.590 GHz.

Table 510 in FIG. 5 shows bias current IBIAS and total current Itotal corresponding to the different operating temperatures (25° C., −30° C., 85° C.). Referring to table 510, the change in total current Itotal from nominal 25° C. room temperature performance is only about six percent (e.g., from 5.0 mA at 25° C. to 4.7 mA at −30° C.) across the entire temperature range of −30° C. to 85° C., as compared to a ten percent change in the conventional amplifier circuit, discussed above. Accordingly, the amplifier circuit 300 likewise provides more current stability in response to fluctuations in temperature than conventional amplifier circuit 100. Also, each bias current IBIAS entry in Table 510 is lower than the corresponding bias current IBIAS entry in the conventional amplifier circuit Table 210, such that the amplifier circuit 300 is able to operate at lower a lower bias current IBIAS at a particular temperature.

Figure 6:
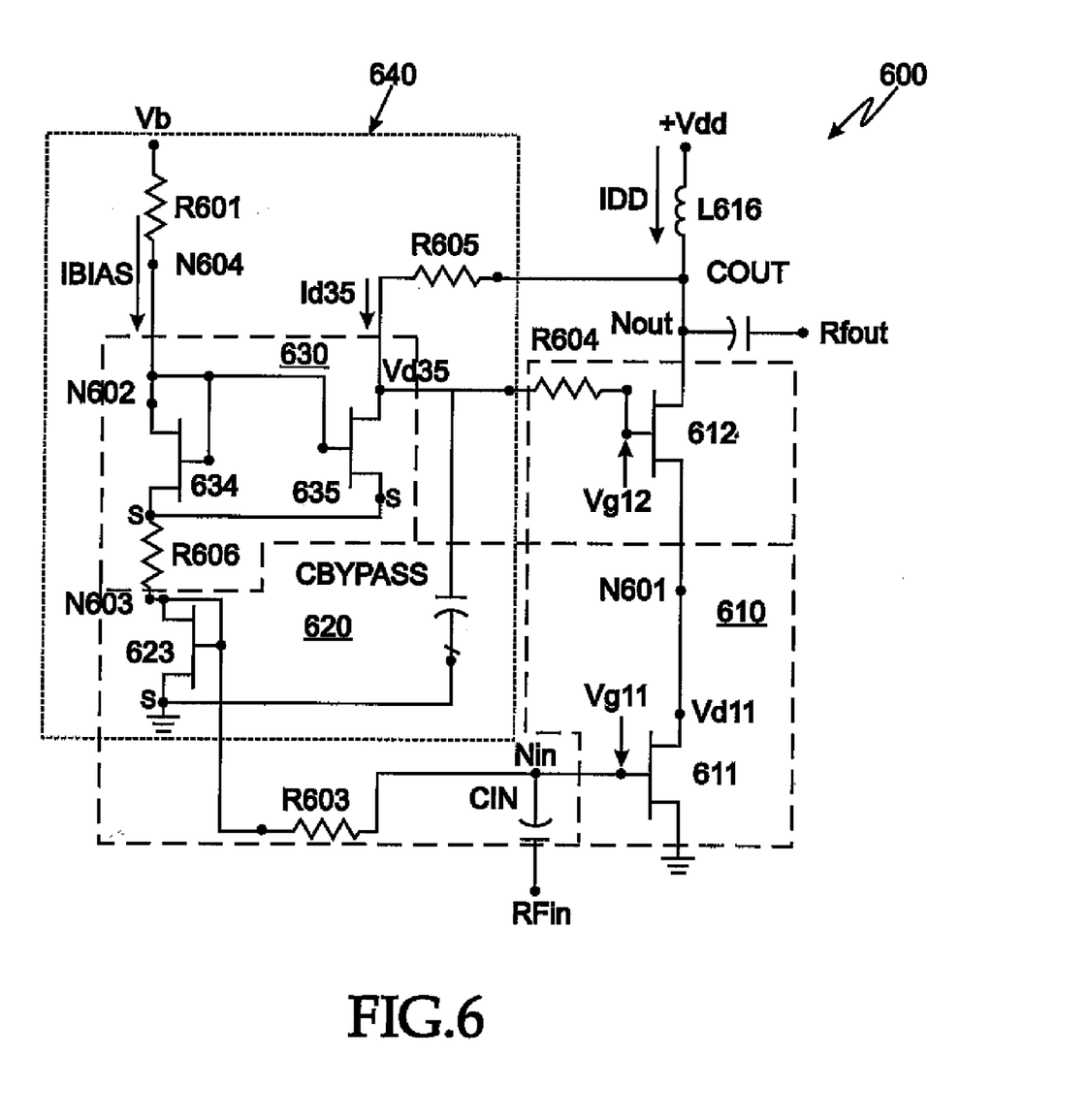
FIG. 6 is a block diagram illustrating an amplifier circuit, according to a representative embodiment.

FIG. 6 is a block diagram depicting an amplifier circuit 600 of an electronic device, according to another representative embodiment. The amplifier circuit 600 may be used to achieve high gain and high linearity with a low quiescent current, for example.

Similar to amplifier circuit 300 of FIG. 3, the amplifier circuit 600 includes cascode amplifier 610 and biasing circuit 640 for biasing the cascode amplifier 610, having a low quiescent current. The biasing circuit 640 provides two current mirrors, first current mirror 620 and second current mirror 630 stacked on first current mirror 620. However, the amplifier circuit 600 includes an additional resistor R606, located between the first current mirror 620 and the second current mirror 630. The resistor R606 may have a resistance value of tens of Ohms to hundreds of ohms, for example. The resistor R606 enables a larger voltage drop across transistor 611 of the cascode amplifier 610. This is beneficial in configurations in which cascode transistors 611 and 612 are sized such that a larger voltage drop across transistor 611 is required to achieve better distortion cancellation between transistors 611 and 612.

Referring to FIG. 6, transistor 611 has a source connected to a low voltage supply (e.g., ground), a drain connected to node N601, and a gate connected to input node Nin. The gate of transistor 611 is also connected to a gate of transistor 623 in biasing circuit 640 through resistor R603, thus forming the first current mirror 620. Transistor 612 has a source connected node N601, a drain connected to output node Nout and a gate connected to low impedance node N602 in biasing circuit 640 through resistor R604. Output node Nout is connected to a power supply voltage source, which provides power supply voltage Vdd. The power supply voltage source is connected to the cascode amplifier 610 through inductor L616, providing current IDD. In the depicted embodiment, the resistance value of resistor R604 is assumed to be close to zero ohms, for example, less than 10 ohms.

A bias voltage source provides bias voltage Vb to the biasing circuit 640. In particular, the bias voltage source is connected to the second current mirror 630 through resistor R601, providing bias current IBIAS. The first current mirror 620 is formed by transistor 611 of the cascode amplifier 610 and transistor 623 of the biasing circuit 640. Transistor 623 includes a source connected to the low voltage source, a drain connected to resistor 606, and a gate connected to the gate of transistor 611 through resistor R603, as well as to the resistor 606. In the depicted embodiment, the resistance value of resistor R603 is assumed to be close to zero ohms, for example, less than 10 ohms.

As stated above, the second current mirror 630 is stacked on the first current mirror 620, and thereby biases transistor 612 of cascode amplifier 610. In particular, the second current mirror 630 includes mirror transistor 634 and amplifier transistor 635. Transistor 634 includes a source connected to resistor R606, a drain connected to bias node N604, and a gate connected to the gate of the transistor 635, as well as to the bias node N604. The bias node N604 is connected to the bias voltage source through bias resistor R601, and thus receives bias current IBIAS. Transistor 635 of the second current mirror 630 includes a source connected to resistor R606, a drain connected to output node Nout through resistor R605, and a gate connected to the gate of transistor 634. In this configuration, the bias current IBIAS is the drain current of transistor 634, and is therefore mirrored through the second current mirror 630 into the drain of transistor 635.

In the depicted configuration of representative amplifier circuit 600, bias to the gate of cascode transistor 612 is taken from the drain of transistor 635. The gate voltage Vg12 of cascode transistor 612 is generated by the drain current of transistor 635, which is based on the mirrored bias current IBIAS. This gate voltage Vg12 may be determined by the power supply voltage Vdd minus the voltage drop across resistor R605, as discussed above with respect transistors 312 and 335 and resistor R304 of FIG. 3.

Linearity of the output signal from amplifier circuit 600 is improved by minimizing drain voltage and drain current changes through the main amplifying transistor, transistor 611. For example, during large signal conditions, when the voltage of the input signal RFin is increased, the current draw through transistor 623 is increased. The increase in current drawn through transistor 623 forces an increase of current through transistor 634. The increased current of transistor 634 is mirrored into the drain of transistor 635 through second current mirror 630, thereby proportionately increasing the current through transistor 635, as well as the current through resistor R605. When the voltage across resistor R605 increases, for example, in response to the increased current through resistor R605, the drain voltage Vd35 of transistor 635 decreases.

As discussed above, the gate voltage Vg12 of transistor 612 is substantially the same as the drain voltage Vd35 of transistor 635. Therefore, the gate voltage Vg12 decreases proportionately with the decreased drain voltage Vd35. The voltage difference between the gate voltage Vg12 and the source voltage Vs12 of transistor 612 is essentially constant. Therefore, when the gate voltage Vg12 decreases, the source voltage Vs12 likewise decreases. Also, the source voltage Vs12 is the same as the drain voltage Vd11 of transistor 611 within cascode 610. Therefore, when the source voltage Vs12 decreases, the drain voltage Vd11 likewise decreases. Since the drain current Id11 of transistor 611 is a function of the drain voltage Vd11, the drain current Id11 also decreases, thus reducing current variation otherwise resulting from the large signal condition or other change in the voltage of input signal RFin. Transistor 611 is thus forced into operating as an amplifier with minimal drain current and drain voltage fluctuations, resulting in a more linear mode of operation, even at large excursions of input signal RFin. Further, current IDD is dependent on the drain voltage Vd11 and the gate voltage Vg11 of transistor 611. Therefore, a change in either one results in a corresponding change in current IDD. For example, when Vd11 decreases, as discussed above, IDD also decreases.

Of course, the resistance value of resistor R606 may vary to provide unique benefits for any particular situation or to meet application specific design requirements of various implementations, as would be apparent to one skilled in the art. Also, it is understood that, in alternative embodiments, the resistor R606 may be replaced by other components capable of inducing different currents through transistors 623 and 634, such as single or multiple resistors, inductors and/or diodes in series or a voltage source, such as a battery.

In addition, the illustrative amplifier circuit 600 of FIG. 6 provides relatively stable OIP3 values during temperature fluctuations, in substantially the same manner as discussed above with respect to amplifier circuit 300 of FIG. 3. Therefore, a detailed description of this functionality will not be repeated.

Generally, though, at elevated temperatures, threshold voltages and corresponding drain currents of the transistors in the amplifier circuit 600 decrease. However, the decreased drain currents of transistors 634 and 635, in particular, result in an increased drain voltage Vd35 of transistor 635. The increased drain voltage Vd35 is reflected in the drain of transistor 611, thus increasing the drain current Id11 through transistor 611, which substantially offsets the decrease in the drain current Id11 through transistor 611 due to the increased temperature. At lower temperatures, threshold voltages and corresponding drain currents of the transistors in the amplifier circuit 600 increase. However, the increased drain currents of transistors 634 and 635 result in a decrease increased drain voltage Vd35 of transistor 635. The decreased drain voltage Vd35 is reflected in the drain of transistor 611, thus decreasing the drain current Id11 through transistor 611, which substantially offsets the increase in the drain current Id11 due to the increased temperature.

The transistors 611, 612, 623, 634 and 635 may be field-effect transistors (FETs), such as gallium arsenide FETs (GaAsFETs), for example. However, other types of FETs and/or other types of transistors within the purview of one of ordinary skill in the art may be incorporated into the amplifier circuit 600, without departing from the spirit and scope of the present teachings. For example, the transistors 611, 612, 623, 634 and 635 may be other types of transistors, such as metal-oxide FETs (MOSFETs), silicon bipolar junction transistors (BJTs), high electron mobility transistors (HEMTs), pseudo-morphic HEMTs, heterostructure FETs (HFETs), junction-gate FETs (JFETs), metal-semiconductor FETs (MESFETs), etc. Further, it is understood that the sources/drains of the various transistors may be reversed, without affecting the relevant functionality of the illustrative amplifier circuit 600, depending on design factors of various embodiments.

The sizes of the various transistors 611, 612, 623, 634 and 635 may vary to provide unique benefits for any particular situation or to meet application specific design requirements of various implementations, as would be apparent to one skilled in the art. Also, in various embodiments, the low voltage sources are not necessarily the same, although transistors within a given current source may be connected to the same low voltage source, either directly or through resistors of proportional value.

Further, the resistors R601, R603, R604 and R605 are depicted as single resistors. However, it is understood that these resistors are intended to indicate resistances at depicted locations within the amplifier circuit 600, and may be implemented by multiple resistors in series, or combinations of resistors, inductors and/or any other components capable of providing the appropriate resistances.

The illustrative embodiments show an amplifier circuit in an electronic device, including multiple current mirrors and a cascode amplifier. The current mirrors enable an output of the cascode amplifier to remain stable during large signal conditions and through fluctuations in temperature.

In view of this disclosure it is noted that variant amplifier circuits and the like can be implemented in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An amplifying device, comprising:
a cascode amplifier configured to receive an input signal and to output an amplified output signal corresponding to the input signal, the cascode amplifier comprising first and second cascode transistors, wherein the first cascode transistor is connected to an input node for receiving the input signal, and the second cascode transistor is connected to a voltage source and an output node for outputting the amplified output signal; and
a biasing circuit configured to bias the cascode amplifier, the biasing circuit comprising a first current mirror and a second current mirror stacked on the first current mirror, the first current mirror comprising the first cascode transistor of the cascode amplifier, and the second current mirror directly biasing the second cascode transistor of the cascode amplifier, wherein the biasing circuit improves linearity of the cascode amplifier, and minimizes changes to a drain voltage and a drain current of the first cascode transistor,
wherein the first current mirror further comprises a first mirror transistor having a gate connected to a gate of the first cascode transistor, and
wherein the second current mirror comprises a second mirror transistor having a same current as the first mirror transistor and a third mirror transistor having a gate connected to a gate of the second mirror transistor, the current of the second mirror transistor being mirrored into the third mirror transistor as a bias current of the cascode amplifier.

2. The device of claim 1, wherein the biasing circuit causes a current through the cascode amplifier to decrease in response to a large signal condition of the input signal, improving the linearity of the cascode amplifier.

3. The device of claim 1, wherein the biasing circuit causes a current through the cascode amplifier to increase in response to an increase in temperature.

4. The device of claim 3, wherein the increase in the current through the cascode amplifier improves an output third order intercept point (OIP3) characteristic of the cascode amplifier.

5. The device of claim 1, wherein the biasing circuit causes a current through the cascode amplifier to decrease in response to a decrease in temperature.

6. The device of claim 5, wherein the decrease in the current through the cascode amplifier improves an OIP3 characteristic of the cascode amplifier.

7. The device of claim 1, wherein a current through the first and second cascode transistors changes inversely with respect to changes in the bias current.

8. A biasing circuit for biasing a cascode amplifier of an amplifying device, the cascode amplifier receiving an input signal and outputting an amplified output signal corresponding to the input signal, the biasing circuit comprising:
a first current mirror configured to receive the input signal; and
a second current mirror connected to the first current mirror and the cascode amplifier, the second current mirror providing a mirrored bias current to the cascode amplifier that varies directly with a current of the first current mirror,
wherein a current of the cascode amplifier varies inversely with respect to the mirrored bias current, reducing changes to the current of the cascode amplifier in response to a changed condition.

9. The biasing circuit of claim 8, wherein, when the changed condition comprises an increase in a voltage of the input signal, the first current mirror current increases in response to the increase in the voltage of the input signal, the mirrored bias current increases in response to the increase in the first current mirror current, and the cascode amplifier current decreases in response to the increase in the mirrored bias current.

10. The biasing circuit claim 8, wherein, when the changed condition comprises an increase in temperature, the first current mirror current decreases in response to the increase in temperature, the mirrored bias current decreases in response to the decrease in the first current mirror current, and the cascode amplifier current increases in response to the decrease in the mirrored bias current.

11. The biasing circuit of claim 8, wherein, when the changed condition comprises a decrease in temperature, the first current mirror current increases in response to the decrease in temperature, the mirrored bias current increases in response to the increase in the first current mirror current, and the cascode amplifier current decreases in response to the increase in the mirrored bias current.

12. A device for amplifying a radio frequency (RF) signal, comprising:
a first transistor comprising a source connected to a low voltage source and a gate connected to an input node for receiving the RF signal;
a second transistor forming a cascode amplifier with the first transistor, the second transistor comprising a source connected to a drain of the first transistor, a drain connected to a voltage source and an output node for outputting an amplified RF signal based on the input RF signal, and a gate connected to a second current mirror;
a third transistor forming a first current mirror with the first transistor, the third transistor comprising a source connected to the low voltage source and a gate connected to the gate of the first transistor;
a fourth transistor comprising a source connected to a drain of the third transistor and a drain connected to a bias voltage source; and
a fifth transistor forming a second current mirror with the fourth transistor, the fifth transistor comprising a source connected to the source of the fourth transistor, a drain connected to the drain of the second transistor and a gate connected to a gate of the fourth transistor,
wherein a drain current of the fifth transistor biases the cascode amplifier.

13. The device of claim 12, wherein, when a voltage of the input RF signal increases, a current through the third transistor increases, which forces an increase in a current through the fourth transistor, which is mirrored into the fifth transistor, reducing a gate voltage of the second transistor.

14. The device of claim 13, wherein the reduced gate voltage of the second transistor causes a reduction in a drain current of the first transistor, which compensates for an increase in the drain current of the first transistor that would otherwise result from the increased voltage of the input RF signal.

15. The device of claim 12, wherein drain currents through at least the first and third transistors decrease in response to an increase in temperature, the decreased current of the third transistor forcing a decrease in a drain current of the fourth transistor, which is mirrored into the fifth transistor, increasing a drain voltage of the fifth transistor and a gate voltage of the second transistor.

16. The device of claim 15, wherein the increased gate voltage of the second transistor causes an increase in the drain current of the first transistor, compensating for the decrease in the drain current of the first transistor that would otherwise result from the increased temperature.

17. The device of claim 12, wherein drain currents through at least the first and third transistors increase in response to a decrease in temperature, the increased current of the third transistor forcing an increase in a drain current of the fourth transistor, which is mirrored into the fifth transistor, decreasing a drain voltage of the fifth transistor and a gate voltage of the second transistor.

18. The device of claim 17, wherein the decreased gate voltage of the second transistor causes a decrease in the drain current of the first transistor, compensating for the increase in the drain current of the first transistor that would otherwise result from the decreased temperature.

* * * * *